United States Patent
Park et al.

(10) Patent No.: US 6,926,572 B2
(45) Date of Patent: Aug. 9, 2005

(54) FLAT PANEL DISPLAY DEVICE AND METHOD OF FORMING PASSIVATION FILM IN THE FLAT PANEL DISPLAY DEVICE

(75) Inventors: Sang Hee Park, Daejon-Shi (KR); Sun Jin Yun, Daejon-Shi (KR); Young Shin Kim, Daejon-Shi (KR); Yong Eui Lee, Seoul-Shi (KR)

(73) Assignee: Electronics and Telecommunications Research Institute (KR)

(*) Notice: Subject to any disclaimer, the term of this patent is extended or adjusted under 35 U.S.C. 154(b) by 35 days.

(21) Appl. No.: 10/331,915

(22) Filed: Dec. 30, 2002

(65) Prior Publication Data

US 2003/0143319 A1 Jul. 31, 2003

(30) Foreign Application Priority Data

Jan. 25, 2002 (KR) .......................................... 2002-4434
Oct. 2, 2002 (KR) ................................ 10-2002-0060108

(51) Int. Cl.[7] .......................... B05D 5/12; C23C 16/00
(52) U.S. Cl. ..................... 445/24; 427/395; 427/255.28
(58) Field of Search ................................ 313/504, 511, 313/512; 427/255.31, 255.394, 255.395, 255.14; 445/24, 25, 58, 9, 11, 14

(56) References Cited

U.S. PATENT DOCUMENTS

| | | | |
|---|---|---|---|
| 5,374,570 A | | 12/1994 | Nasu et al. |
| 5,496,597 A | | 3/1996 | Soininen et al. |
| 5,909,081 A | * | 6/1999 | Eida et al. .................. 313/504 |
| 5,952,778 A | | 9/1999 | Haskal et al. |
| 6,270,572 B1 | | 8/2001 | Kim et al. |
| 6,743,475 B2 | * | 6/2004 | Asikainen et al. ...... 427/255.31 |
| 2001/0046558 A1 | * | 11/2001 | Kim et al. ............. 427/255.29 |
| 2001/0052752 A1 | * | 12/2001 | Ghosh et al. ............... 313/512 |
| 2002/0003403 A1 | * | 1/2002 | Ghosh et al. ............... 313/512 |

FOREIGN PATENT DOCUMENTS

JP 2001-284042 10/2001

OTHER PUBLICATIONS

J. Vac. Sci. Technoi. A. 15 (6) Nov./Dec. 1997, Dependence of Atomic layer-deposited AlcO3 films characteristics on growth temperature and Al percursors of Al (CH3)3 and AlCl3, S. Yun et al., 5 pages.

* cited by examiner

Primary Examiner—Joseph Williams
Assistant Examiner—Glenn Zimmerman
(74) Attorney, Agent, or Firm—Blakely Sokoloff Taylor & Zafman

(57) ABSTRACT

A method of forming a passivation film in a flat panel display device includes forming the flat panel display device on a substrate, bringing the flat panel display device into a chamber in order to form the passivation film, injecting precursors containing constituent elements of the passivation film into the chamber where the precursors include at least oxygen plasma, ammonia plasma, or nitrogen plasma, and forming the passivation film of an inorganic insulating material at a temperature of 20–220° C. through a surface chemical reaction between the precursors by a plasma enhanced atomic layer deposition method.

20 Claims, 3 Drawing Sheets

FLAT PANEL DISPLAY DEVICE AND METHOD OF FORMING PASSIVATION FILM IN THE FLAT PANEL DISPLAY DEVICE

BACKGROUND OF THE INVENTION

1. Field of the Invention

The invention relates to a flat panel display device and a method of forming a passivation layer in the flat panel display device. More particularly, it relates to a method of forming a passivation layer deposited by means of an atomic layer deposition method through a surface chemical reaction between precursors, which include atomic elements of the passivation layer.

2. Description of the Prior Art

With an advent of $21^{st}$ century of higher information era, researches and developments on a next-generation display device have increasingly been important. In particular, the development of materials for use in display devices for communications and computers is important and will be more important in the future. Among the flat panel displays, an organic electroluminescence (OEL) device or an organic light-emitting device (OLED) bears particular significance, because the display devices offer self-emitting lights.

The organic light-emitting device (OLED) has different characteristics from other flat panel display devices such as a liquid crystal display (LCD), a cathode ray tube (CRT), a plasma display panel (PDP), and the like. The OLED device is also recognized as a flat panel display device that can implement a foldable display technology, which can be a next-generation display device. The OLED device is currently available for a LCD back light or a portable display device.

In organic light-emitting device, electrons and holes form electron-hole pairs within a semiconductor material. The electron-hole pairs are recombined to emit light. Also, the organic light-emitting device emits the light of three primary colors under an operating voltage of below 10V, relatively low voltage level, and it can implement a high resolution and a natural color. Furthermore, the display device has advantages such as a low cost fabrication, flexibility, and a rapid response time.

The structure of the organic light-emitting device will be explained. The organic light-emitting device is an injection-type thin film device having a light-emitting layer and a transporting layer. The organic light-emitting device and an inorganic semiconductor device are common in that they are light-emitting devices using electron-hole pairs. However, unlikely the P-N junction LED in which recombination is governed by injection of the minority carriers at the junction interface, in the organic light-emitting device, all of the carriers that contribute light-emitting are injected from an external electrode. In other words, the carrier-injection type light-emitting device requires an efficient electron injection and electron transportation organic material. The stack structure of the organic light-emitting device is mainly classified into a single film and a multi-layer. In the present description, only the organic light-emitting device having the multi-layer structure will be described by reference to FIG. 1.

FIG. 1 is a cross-sectional view of the conventional organic light-emitting device of the multi-layer structure. The organic light-emitting device has a structure in which a substrate 10, an anode electrode 12, a hole injection layer 14, a hole transporting layer 16, an emitting layer 18, an electron transporting layer 20, an electron injection layer 22 and a cathode electrode 24 are stacked.

As described above, the organic light-emitting device has disadvantages that it is easily degraded by internal factors such as degradation of the cathode electrode due to oxygen, degradation of the light-emitting layer due to oxygen from ITO, degradation due to reaction between the light-emitting layer and the interface or the like, and by external factors such as moisture, oxygen, ultraviolet rays, manufacture conditions of the device, and the like. In particular, packaging of the organic light-emitting device is very important since external oxygen and moisture give a fatal effect on the lifetime of the device.

Only several technologies on packaging the organic light-emitting device have been reported. One of the technologies that have been widely used is a structure in which a passivation metal can 26 is covered over the cathode electrode as shown in FIG. 1.

Another technology of packaging the organic light-emitting device was disclosed in U.S. Pat. No. 5,952,778 (hereinafter called '778 patent') entitled 'Encapsulated Organic light-emitting device' issued on Mar. 18, 1997. The 778 patent discloses a method which a metal relatively less sensitive to moisture or oxygen, for example Al or transition metals, etc. is deposited on the cathode electrode of the organic light-emitting device. By using same mask as the cathode electrode, an inorganic insulating film (for example, a silicon oxide film, a silicon nitride film, etc.) is formed under a vacuum. The deposition method may include an ion beam deposition method, an electron beam deposition method, a plasma beam deposition method, a chemical vapor deposition method, or the like. Hydrophobic polymers such as polysiloxane, polytetrafluethtylene, etc. are formed on the inorganic insulating film, thus the organic light-emitting device being encapsulated.

U.S. Pat. No. 5,496,597 relates to a thin inorganic insulating film manufactured by means of the atomic layer deposition method. This technology presents a new method using various organometallic compounds in order to form a dielectric layer of the electroluminescent display device. However, this conventional method discloses only a high temperature process, which is useful for the fabrication of dielectric thin film having high breakage strength and a low leakage current.

Furthermore, another prior art is an article entitled 'Dependence of Atomic layer-Deposited $Al_2O_3$ layers Characteristics on Growth Temperature and Al Precursor of $Al(CH_3)_3$ and $AlCl_3$ that was reported in J. Vac. Sci. Technol. A by S. J. Yun (1997). This article discloses a technology relating to variations in the characteristics depending on the type and growth temperature of an Al precursor in forming the $Al_2O_3$ insulating film. Like the '778 patent, this prior art discloses only a high temperature process of over 250° C.

As described above, the methods of fabricating the inorganic insulating film according to the prior arts have disadvantages that the deposition temperature is relatively high, the step coverage of the thin film is poor and the density thereof is not good. Therefore, a method capable of forming the inorganic insulating film at low temperature and having good characteristics is required.

As the information society is rapidly progressed, needs for a versatile and highly qualified display technology is increased. Plastic substrate for a foldable display device or a flexible display device is easily deformed under high temperature process. It is, therefore, inevitably necessary to manufacture an inorganic insulating film at a low temperature so that a cheap plastic is not deformed during the manufacturing the display such as a digital paper as well as the organic light-emitting device, on the plastic substrate.

SUMMARY OF THE INVENTION

The present invention is contrived to solve the above problems and an object of the present invention is to manufacture barrier film at low temperature for the protection of a flat panel display device.

Another object of the present invention is to manufacture a passivation film having a good characteristic through simple process.

Still another object of the present invention is to manufacture an inorganic insulating film at a low temperature for forming the passivation film of flexible substrate used in a digital paper, TFT-LCD, organic thin film transistor (OTFT), OLED, and etc..

A method of forming a passivation film in a flat panel display device according to one aspect of the present invention is characterized in that it comprises the steps of forming a flat panel display device on a substrate, locating the flat panel display device formed on the substrate at a chamber in order to form the passivation film, injecting precursors containing elements constituting the passivation film into the chamber, and forming the passivation film at a temperature of 20~220° C. using an atomic layer deposition method through a surface chemical reaction between the precursors.

Further, a method of forming a passivation film in a flat panel display device according to another aspect of the present invention is characterized in that it comprises the steps of locating a plastic substrate within a chamber in order to form a passivation film injecting precursors containing elements constituting the passivation film into the chamber, forming the passivation film of an inorganic insulating film at a temperature of 20~220° C. using an atomic layer deposition method through a surface chemical reaction between the precursors, and manufacturing the flat panel display device on the substrate in which the passivation is formed on the entire surfaces of an upper side, a lower side and lateral sides, or the surfaces including a part of them.

Preferably, the flat panel display device is an organic light-emitting device in which a first electrode, a light-emitting layer and a second electrode are formed on the substrate wherein light is emitted through the substrate.

Further, it is possible to additionally form an organic insulating film before and/or after the inorganic insulating film is formed. The inorganic insulating film is one of $Al_2O_3$, ZnO, $TiO_2$, $Ta_2O_5$, $ZrO_2$, $HfO_2$, $SiO_2$, $Si_3N_4$, AlN and AlON. The organic insulating film may be fabricated by the method of TCVDPF (thermal chemical-vapor-deposition polymer).

Meanwhile, it is preferred that the passivation layers are composed of dual structure of organic insulating film and the inorganic insulating film or multi-layer stack structure including organic insulating film and the inorganic insulating repeatedly.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
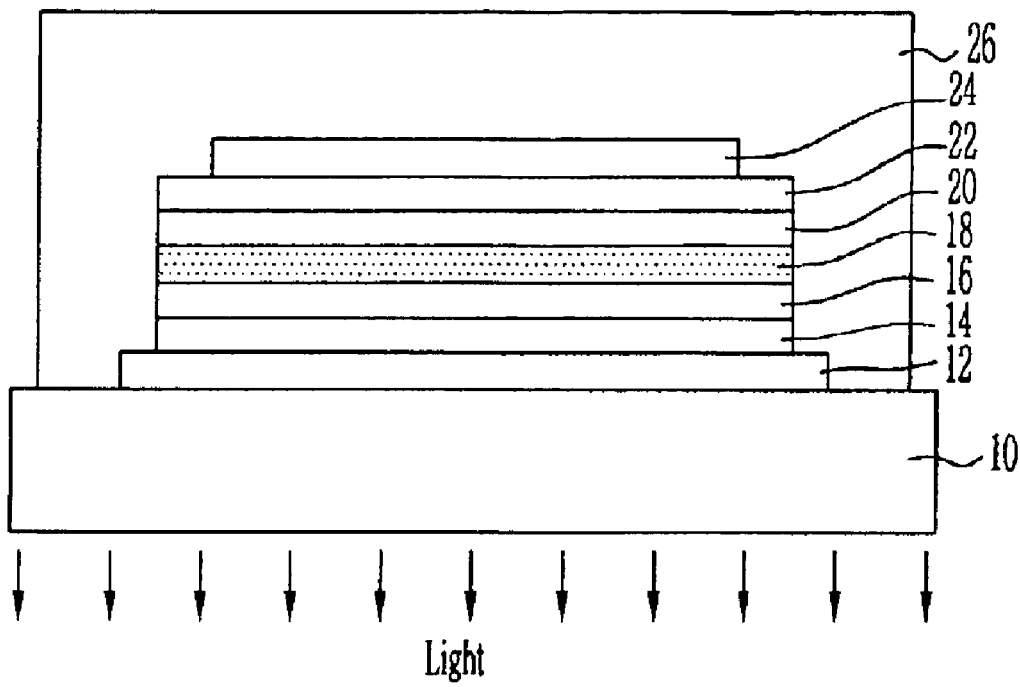
FIG. 1 is a cross-sectional view of a conventional organic light-emitting device of a multi-layer structure.

The present invention will be described in detail by way of a preferred embodiment with reference to accompanying drawings, in which like reference numerals are used to identify the same or similar parts.

"Flat panel display device" means all of the display devices that are manufactured using a glass substrate, a plastic substrate, a silicon substrate, and the like. For example, the types of the flat panel display device are an organic light-emitting device, an electric field emission device, a liquid crystal display device, a digital paper, or the like. The flat panel display device adopted in the present invention is the organic light-emitting device.

(Embodiment 1)

Figure 2:
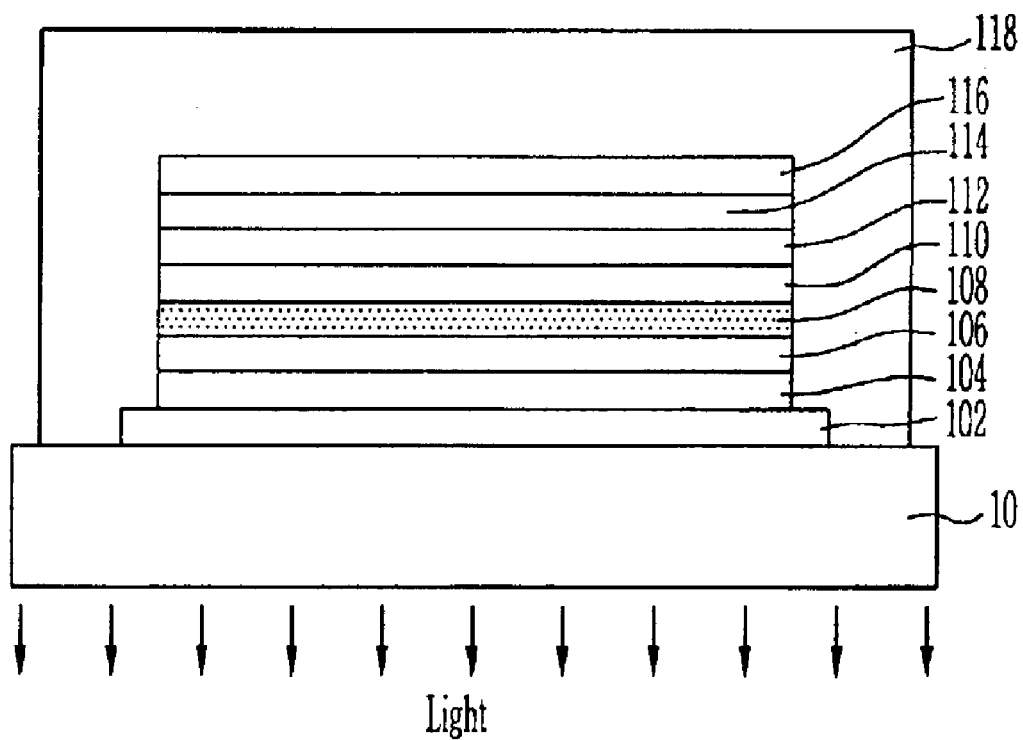
FIG. 2 and FIG. 3 are cross-sectional views of organic light-emitting devices for explaining a method of forming a passivation film in the organic light-emitting device according to first and second embodiments of the present invention, respectively.

FIG. 2 is a cross-sectional view of an organic light-emitting device for explaining a method of forming a passivation film in the organic light-emitting device according to the embodiment 1 of the present invention. FIG. 2 shows an organic light-emitting device in which emitted lights penetrate a transparent substrate.

Referring now to FIG. 2, the organic light-emitting device has a structure in which an anode electrode 102, a hole injection layer 104, an hole transporting layer 106, a light-emitting layer 108, an electron transporting layer 110, an electron injection layer 112 and a cathode electrode 114 are stacked on a transparent substrate 100. The transparent substrate 100 may be made of a glass substrate or a plastic substrate.

In order to passivate the organic light-emitting device, a metal film 116 is formed on the cathode electrode 114. The metal film 116 may be made of Al or a transition metal that is more insensitive to oxygen or moisture than the cathode electrode 114. A passivation film 118 is then made of an inorganic insulating film in order to passivate an active layer in the organic light-emitting device. In this case, the passivation film 118 may have a dual structure of an organic passivation film and an inorganic passivation film, and may have even multi-layer structure in which at least one of inorganic passivation film and organic passivating are stacked repeatedly.

Furthermore, it should be noted that the substrate 100 might be a glass substrate, a plastic substrate, a silicon substrate of a top emission type that is usually used in EL, or the like.

The anode electrode 102, an electrode for injecting holes, is made of transparent metal oxide having a high level of work function so that emitted light can pass through the transparent substrate. The hole injection electrode that has been widely used is ITO (indium tin oxide) of about 50~200 nm in thickness. ITO is advantageous in the optical transparency but has a difficulty in being controlled. Recently, it is considered that conjugated polymer, for example, PT (polythiophene), etc. is used as the hole injection electrode. The conjugated polymer can prevent a reduction in the efficiency caused by non-emission recombination at the anode electrode 102 having a high level work function.

The hole injection layer 104 serves to supply holes to the hole-transporting layer 106. The holes are provided from the anode electrode 102. Meanwhile, the hole-transporting layer 106 is made of TPD, a diamine complex material, and poly (9-vinylcarbazole), photo-conductive polymer. The electron-transporting layer 110 is made of oxadiazole derivatives or the like. Through the combination of these transporting layers, it is possible to increase the photons out per charge injected and to lower the driving voltage through two-step injection of the transporting layer without the carriers being directly injected. Furthermore, it is possible to control the recombination rate since the electrons and holes injected into the light-emitting layer 108 are clogged at the opposite transporting layer when they are moved toward the opposite electrode through the light-emitting layer 108. It is thus possible to improve the light-emitting efficiency. As singlet excitons generated by the recombination of the electrons and holes exist at the interface between the electrode and the light-emitting layer, it can prevent an occurrence of quenching effect (as emitting sites are closer, emission of a material is decreased).

The light-emitting layer 108 is made of polymer organic EL such as $Alq_3$, anthracene, etc., PPV (p-phenylenevinylene), PT (polythiophene) or derivatives of them. Researches have been made on a thin light-emitting layer (EML) 108 (for example, 100 nm) in order to emit charges at a low driving voltage.

The light-emitting layer 108 is intervened between the electron-transporting layer 110 and the electron injection and located in opposite side to the hole injection layer 104 and the hole transporting layer 106. The anode electrode 102 of the organic light-emitting device injects holes into the light-emitting layer 108 through the hole-transporting layer 104. The cathode electrode 114 injects electrons into the light-emitting layer 108 through the electron injection layer. Therefore, as the electrons and holes are combined at the light-emitting layer 108, light is generated.

The cathode electrode 114, an electrode for injecting electrons, is made of Ca, Mg, Al, etc. of a low level of work function. The metals having a low level work function is employed as the electron injection electrode, since a high current density can be obtained in injecting electrons by lowering a barrier between the cathode electrode 114 and the light-emitting layer 108. It is, therefore, found that Ca of the lowest level of work function has a high efficiency but Al having relatively high level of work function has a low efficiency. However, Ca is easily oxidized under oxygen or moisture and Al is relatively stable in the air.

The metal film 116 is made of Al, a transition metal, etc. that are more insensitive to oxygen or moisture than the cathode electrode 114.

After the organic light-emitting device is made through the above process, the passivation film 118 for passivating the organic light-emitting devices is formed. The passivation film 118 may be formed, by adding an organic insulating film, a metal film for the passivation film, or the like to the inorganic insulating film. Furthermore, the metal film for passivation and the inorganic insulating film may be formed to have a consecutive multi-layer structure using the atomic layer deposition method such as a traveling type, a plasma type, and the like. It is also preferred that the metal film for passivation is made of materials such as Al, W, TaN, TiN, or the like.

A method of forming the passivation film 118 will be below described.

The passivation film 118 is formed through growing the inorganic insulating film using the atomic layer deposition method under low temperature, about 20~220° C. Under this temperature, the thin film can be formed with the organic light-emitting device not damaged. Preferably, the inorganic insulating film may be an insulating film such as $Al_2O_3$, ZnO, titanium oxide, tantalum oxide, $ZrO_2$, $HfO_2$, $SiO_2$, $Si_3N_4$, AlN, AlON, or the like.

The inorganic insulating film deposition will be explained in detail, the growth of $Al_2O_3$ taken as an example. In aluminum oxide, trimethylaluminum or triethylaluminum may be used as a precursor of aluminum because of stability and low price. But, other organic metal aluminum precursor may be used. Alcohol type materials such as methanol, ethanol, isopropyl alcohol, etc., water or ozone ($O_3$) may be used as a precursor of oxygen. In plasma deposition, oxygen, water or alcohol plasma may be used. In aluminum nitride, trimethylaluminum or triethylaluminum may be used as a precursor of aluminum because of stability and low price. $NH_3$ or $N_2$ plasma may be used as a nitrogen precursor.

It should be noted that the atomic layer deposition methods of various kinds are available. The atomic layer deposition method is classified into a traveling wave reactor deposition method and a plasma-enhanced atomic layer deposition method. Furthermore, the plasma-enhanced atomic layer deposition method is classified into a remote plasma atomic layer deposition method and a direct plasma atomic layer deposition method depending on a plasma generating apparatus. Therefore, in the present invention, for example, the thin $Al_2O_3$ layer is deposited at room temperature~220° C. using trimethyaluminum and water by means of the traveling wave reactor deposition method.

Figure 4:
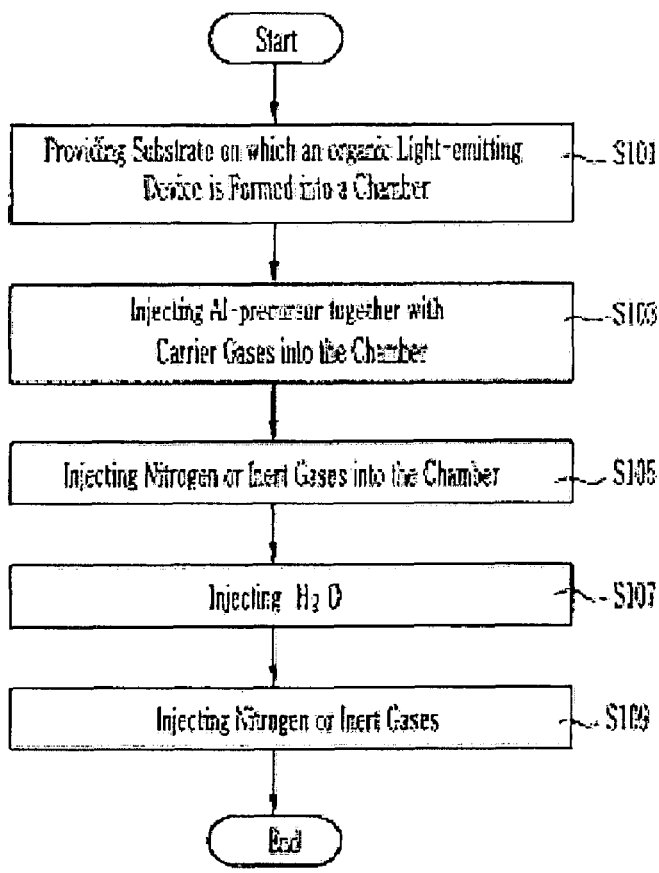
FIG. 4 is a flowchart for explaining a method of forming the passivation film in the organic light-emitting device according to one embodiment of the present invention.
Figure 5A:
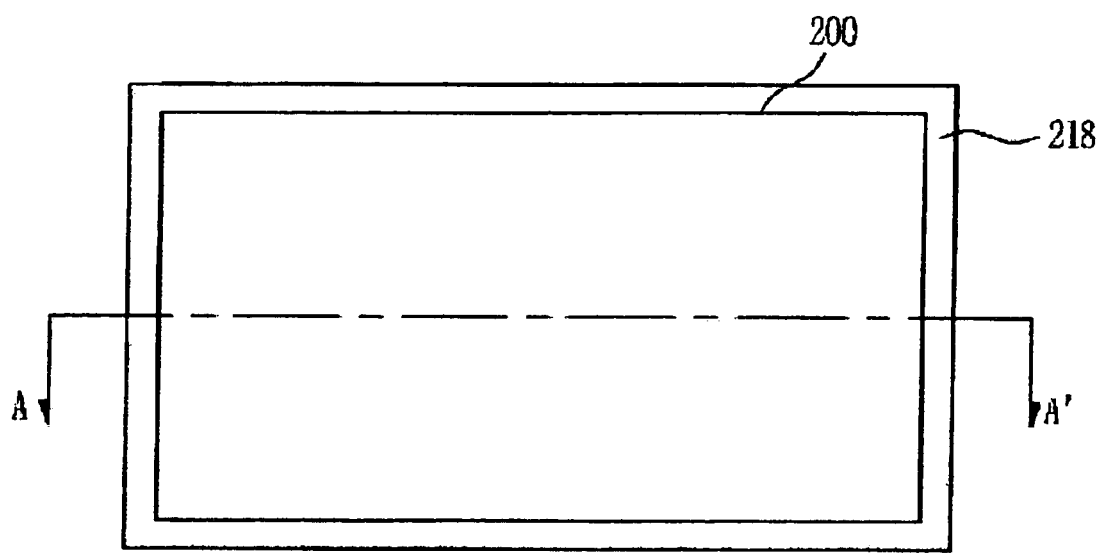
FIG. 5A shows one example of a plan view of a substrate having passivation film according to another embodiment of the present invention.
Figure 5B:
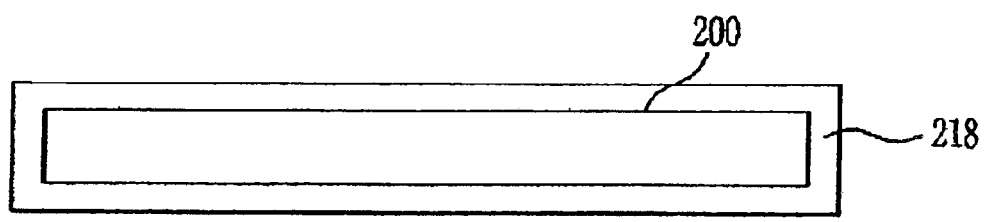
FIG. 5B shows a cross-sectional view of FIG. 5A, taken along line A–A'. Referring FIGS. 5A and 5B, the passivation film 218 is formed on the entire surfaces of the upper side, a lower side and lateral sides on the substrate 200.

A process of depositing the passivation film 118 of the inorganic insulating film will be described in detail by reference to FIG. 4.

The organic light-emitting device with all films (except for the passivation film 118 of the inorganic insulating film) is brought into a chamber of the atomic layer deposition equipment (S101). The temperature of the chamber is maintained at 150° C. Trimethyaluminum vapor is then injected into the chamber together with carrier gases such as nitrogen, argon, etc. (S103). Thereby, Al-precursor reactants are adhered to the surface of the organic light-emitting device.

Nitrogen or inert gases are injected into the chamber (S105). Through the above process, Al-precursor reactants, which are not adhered to the surface of the organic light-emitting device, are removed.

Thereafter, $H_2O$ gases are injected into the chamber (S107). At this time, the $H_2O$ gas reacts with the Al-precursor reactants adhered to the surface so that a thin $Al_2O_3$ layer is grown to produce volatile by-products.

Then, nitrogen or non-volatile gases are injected into the chamber (S109). As same in the step (S105), volatile by-products between the Al-precursor and $H_2O$ containing extra $H_2O$ molecules are removed in this step.

Preferably, the above processes (S103~S109) are repeated several times to obtain a desired thin $Al_2O_3$ layer.

According to the reaction processes, a thin film can be grown at the deposition rate of below one monolayer/one cycle. Therefore, a thin $Al_2O_3$ layer having a matched composition ratio of atoms can be grown. The $Al_2O_3$ layer has almost no pin-hole and a good step coverage.

A characteristic of the passivation film manufactured will be below described.

The thin $Al_2O_3$ layer grown with precursors of TMA and water at a temperature of 150° C. has a growth rate of 0.90~1.3 Å/cycle. When the thickness of the film fabricated by 2000 cycles of ALD process is 189.9 nm measured at a wavelength of 632.8 nm, the refractive index of the thin $Al_2O_3$ layer is 1.605. The thickness of the thin $Al_2O_3$ layer grown at the temperature of 130° C. has the refractive index of 1.618 and the thickness is 211.3 nm. This refractive index represents the densification of the thin $Al_2O_3$ layer. It was thus found that the thin $Al_2O_3$ layer having the refractive index of 1.605 has a similar characteristic to the passivation film grown by the atomic layer deposition method at a high temperature. The thin film grown at a temperature of 350° C. has a refractive index of 1.647. Furthermore, it was found that the composition ratio of Al:O measured by RBS (Rutherford backscattering spectrometer) analysis is 35:65, which contains more oxygen than an ideal ratio of 40:60. But, the composition of Al and O is improved if the plasma-enhanced ALD method is used with precursors of ozones or oxygen plasma. It is also found that the surface photography of the thin $Al_2O_3$ layer grown at a low temperature shows as a good morphology as that of the film grown at 350° C. In particular, the thin $Al_2O_3$ layer has a good transparency. The transmittance within the visible range of $Al_2O_3$ layer deposited on the plastic substrate is higher than that of substrate itself. Therefore, considering the characteristics, the thin $Al_2O_3$ layer can sufficiently be adapted to a passivation film of the display device Meanwhile, the characteristic of the thin film corresponding to the changes of growth temperature will be described. In the case of water precursor, it was found that the $Al_2O_3$ layer is not grown at a temperature of less than 70° C. In the case of plasma precursor, it was found that the $Al_2O_3$ layer is grown at a room temperature. The plastic substrate is not available at over 220° C., thus it is considered that a preferable process temperature is room temperature~220° C.

Meanwhile, the passivation film may be formed with a multi-layer structure of the inorganic insulating film and the organic insulating film. In this structure the organic insulating film is formed on and/or below the inorganic insulating film. This structure may be formed by repeatedly stacking the organic insulating film and the inorganic insulating film on the metal film 116 by N times. The organic insulating film may be formed using a vacuum deposition method and a spin coating method. For example, a thermal chemical-vapor-deposition polymer (TCVDPF) film is formed with the process of thermally vaporizing and polymerizing the monomer. It should be noted that the type of monomer is not specially limited. The polymer may include PPX (parylene (poly-p-xylylene), PCPX (poly-2-chloro-p-xylylene), poly[2-methoxy-5-(2'-ethyhexyl loxy)-1,4-phenylene vinylene], or the like. The type of polymer may include a Teflon series. The thickness of the organic insulating film may be approximately 0.5~several $\mu m$.

Furthermore, it is possible to add the metal film for passivation on the inorganic insulating film. The inorganic insulating film and the metal film for the passivation film such as Al, W, TaN, TiN, or the like may be formed on the metal film 116. At this time, the inorganic insulating film and the metal film for passivation may have a multi-layer structure including at least one of inorganic insulating film and the metal film for passivation. The metal film for passivation may be deposited in thickness of about 1000 Å by means of a thermal evaporation method, a sputtering deposition method, the atomic layer deposition method, or the like. Addition of the metal film for passivation improves the protection of water.

In addition, if necessary, the organic insulating film may be formed on the inorganic insulating film due to an adhesion with the metal film 116, etc. The organic insulating film may be formed between the metal film for passivation and the inorganic insulating film. If water, oxygen or ozone, etc. are used as a precursor of aluminum oxide and the passivation film contacts to the active film in the organic light-emitting device, preferably, the organic insulating film may be firstly formed in order to prevent the precursor from directly contacting the active layer of the organic light-emitting layer.

Furthermore, it is possible to form a triple structure of the organic insulating film/inorganic insulating film/metal film for the passivation film. In summary, it is possible to form a 2 layer, 3 layer structure or a multi-layer structure in which the films are stacked by one~five times including at least the inorganic insulating film among the organic insulating film, the inorganic insulating film and the metal film for passivation.

(Second Embodiment)

Figure 3:
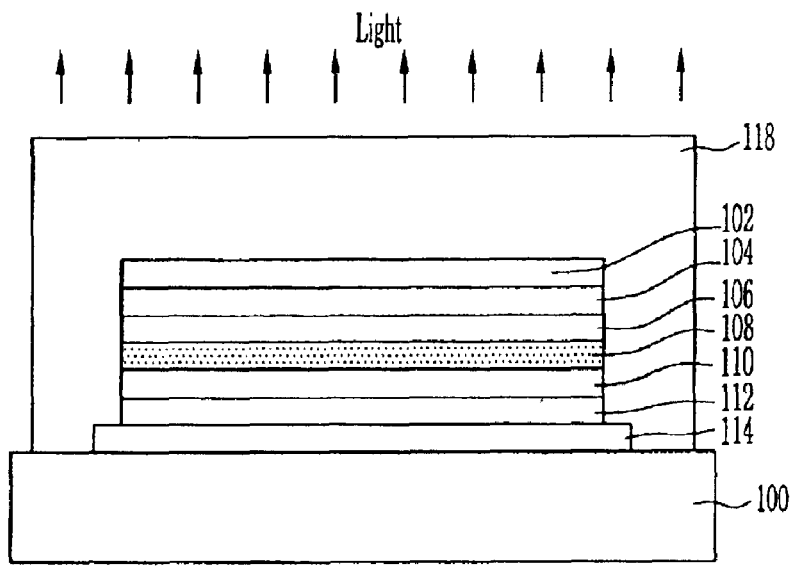

FIG. 3 is a cross-sectional view of the organic light-emitting device for explaining a method of forming the passivation film in the organic light-emitting device according to the second embodiment of the present invention. FIG. 3 is a cross-sectional view of the organic light-emitting device of the top emission mode (light is emitted toward the upper side).

Unlike the organic light-emitting device shown in FIG. 2, the organic light-emitting device of the second embodiment has a cathode electrode 114, an electron injection layer 112, an electron transporting layer 110, a light-emitting layer 108, a hole transporting layer 106, a hole injection layer 104 and an anode electrode 102, all of which are stacked on a non-transparent substrate 200 of Si, etc., so that light is emitted toward an upper side. Another top emission type of organic light-emitting device has a transparent upper metal electrode. This organic emitting device may have a structure in which a transparent electrode is then formed on the transparent upper metal electrode.

In order to passivate the organic light-emitting device manufactured thus, a passivation film 118 is made of an inorganic insulating film. In this case, the method of deposition is nearly same as that of the first embodiment. Detail explanations on the method of forming the inorganic insulating film will be thus omitted for the convenience of explanation.

Meanwhile, in case of the organic light-emitting device in which the cathode electrode 114 is used as a lower electrode neighboring to the substrate 200 and the anode electrode 102 is used as an upper electrode, as shown in FIG. 3, the insulating film can be successively formed without a metal film, when a transparent oxide electrode such as ITO, ZnO:Al, or the like is deposited as the upper electrode. It is therefore possible to simplify the packaging process.

Needless to say, the passivation film may be formed to have a multi-layer structure of the inorganic insulating film and the organic insulating film in which the organic insulating film is formed on and/or below the inorganic insulating film. In other words, it is possible to form the multi-layer structure in which at least one of organic insulating film and organic insulating film are stacked. In particular, as described above, a case that a transparent oxide electrode such as ITO, ZnO:Al, or the like is deposited as an upper electrode is relatively good in an adhesive state between the transparent oxide electrode and the inorganic insulating film. Therefore, the adhesive state is good even when either the inorganic film or the organic insulating film is first deposited.

In another embodiment of the present invention, it is possible to deposit an inorganic insulating film of a low temperature process ($Al_2O_3$, ZnO, titanium oxide, tantalum oxide, $ZrO_2$, $HfO_2$, $SiO_2$, $Si_3N_4$, AlN and AlON) on the entire surfaces or a part of the substrate as described above. In other words, an upper side, a lower side and lateral sides of the substrate (for example, in case that the inorganic insulating film is formed only on the upper side in which the device will be formed) may be used in order to passivate the substrate or to prevent an impurity of the substrate from penetrating the device.

In particular, as a result of measuring UV-Vis spectrum of $Al_2O_3$, etc., a good transparency due to the refractive index can be obtained compared to the plastic substrate itself. It was also found that $Al_2O_3$ is suitable for the passivation film of the display device. It is therefore possible to passivate the entire substrate with the passivation film using this characteristic. If necessary, it is possible to stack the inorganic insulating film or the organic insulating film as the multi-layer structure. Further, it is possible that the inorganic insulating film and the metal film for the passivation film are formed to have a multi-layer structure, and this structure and the organic insulating film are formed to have a multi-layer structure. In case that the metal film for the passivation film is added, the multi-layer structure may be nontransparent depending on the thickness of the film. It is thus preferred that the metal film for the passivation film is adopted as the top emission structure.

As mentioned above, the present invention has advantages that it can not only manufacture a passivation film having a good characteristic at a low temperature but also maintain the lifetime and characteristic of the device using the passivation film as a protection film for a digital paper and devices sensitive to moisture and oxygen as well as an organic light-emitting device, when the insulating film is manufactured using a surface reaction of precursors containing elements constituting a thin film and a chemical reaction of vapor.

According to the present invention, the insulating film is deposited at a low temperature. The present invention has an advantage that it can extend the lifetime of a flexible device in an organic light-emitting device or a digital paper, by using moisture, oxygen, and the like contained in a plastic substrate as a passivation film for effectively precluding from a device formed on a substrate.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming a passivation film in a flat panel display device, comprising:

forming the flat panel display device on a substrate;
   bringing the flat panel display device into a chamber in order to form the passivation film;
   injecting precursors containing constituent elements of the passivation film into the chamber, the precursors including at least one of oxygen plasma, ammonia plasma, and nitrogen plasma; and
   forming the passivation film of an inorganic insulating material at a temperature of 20 to about 220° C. through a surface chemical reaction between the precursors by plasma enhanced atomic layer deposition method.

2. The method as claimed in claim 1, wherein the flat panel display device is an organic light-emitting device in which a first electrode, a light-emmitting layer and a second electrode are formed on the substrate, and wherein emitted light from the organic light-emitting device penetrate the substrate.

3. The method as claimed in claim 2, wherein an organic insulating film and/or a metal film for passivation are/is added to the inorganic insulating film so that the total passivation film has a two layer structure, a three layer structure or a multi-layer structure, the organic insulating film and/or the metal film for passivation and the inorganic film are stacked by at least one time.

4. The method as claimed in claim 3, wherein the organic insulating film is a thin (thermal chemical-vapor-deposition polymer) film.

5. The method as claimed in claim 1, wherein the flat panel display device is an organic light-emitting device in which a first electrode, a light-emitting layer and a second electrode are formed on the substrate, and wherein the organic light-emitting device is emitted in a top emission mode.

6. The method as claimed in claim 5, wherein an organic insulating film is added to the inorganic insulating film so that the total passivation film has a two layer structure or a multi-layer structure, in which the organic insulating film and the inorganic film are stacked by at least one time.

7. The method as claimed in claim 1, wherein the inorganic insulating film is one of $Al_2O_3$ZnO, titanium oxide, tantalum oxide, $ZrO_2$, $HfO_2$, $SiO_2$, $Si_3N_4$, AlN and AlON.

8. The method as claimed in claim 1, wherein the substrate is a glass substrate or a plastic substrate.

9. The method as claimed in claim 1, wherein the inorganic insulating film is formed using one of a remote plasma atomic layer deposition method and a direct plasma atomic layer deposition method.

10. The method as claimed in claim 1, wherein the inorganic insulating film is $Al_2O_3$, the precursors include aluminum precursor and oxygen plasma the aluminum precursor is trimethylaluminum or triethylaluminum.

11. A method forming a passivation film in a flat panel display device, comprising:

forming the flat panel display device on a substrate;
   bringing the flat panel display device into a chamber in order to form the passivation film;
   injecting precursors containing constituent elements of the passivation film into the chamber; and
   forming the passivation film of an inorganic insulating material at a temperature of 20 to 220° C. through a surface chemical reaction between the precursors by an atomic layer deposition method,
   wherein the inorganic insulating film is aluminum nitride, the precursors include an aluminum precursor and a precursor of nitrogen, the aluminum precursor is trimethylaluminum or triethylaluminum, and the nitrogen precursor is an ammonia plasma or nitrogen plasma.

12. A method of forming a passivation film onto a flexible substrate comprising:

bringing a substrate into a chamber in order to form a passivation film;

injecting precursors containing elements constituting the passivation film into the chamber;

forming the passivation film of an inorganic insulating material at a temperature of 20 to about 220° C. through a surface chemical reaction between the precursors by an atomic layer deposition method; and manufacturing the flat panel display device on the substrate in which the passivation film is formed on the entire surfaces of the upper side, a lower side and lateral sides, or the surfaces including a portion of them.

13. The method as claimed in claim 12, wherein the flat panel display device is an organic light-emitting device in which a first electrode, a light-emitting layer and a second electrode are formed on the substrate, wherein emitted light from the organic light-emitting device penetrate the substrate, and wherein an organic insulating film is added to the inorganic insulating film so that the total passivation film has a two layer structure or a multi-layer structure, in which the organic insulating film and the inorganic film are stacked by at least one time.

14. The method as claimed in claim 12, wherein the flat panel display device is an organic light-emitting device in which a first electrode, a light-emitting layer and a second electrode are formed on the substrate, wherein the organic light-emitting device is emitted in a top emission mode, and wherein an organic insulating film and/or a metal film for passivation are/is added to the inorganic insulating film so that the total passivation film has a two layer structure, a three layer structure or a multi-layer structure, the organic insulating film and/or the metal film for passivation and the inorganic film are stacked by at least one time.

15. The method as claimed in claim 12, wherein the inorganic insulating material is $Al_2O_3$, ZnO, titanium oxide, $ZrO_2$, $HfO_2$, $SiO_2$, tantalum oxide $SiO_3N_4$, AlN or AlON.

16. The method as claimed in claim 12, wherein the organic insulating film is a thin (thermal chemical-vapor-deposition polymer) film.

17. The method as claimed in claim 12, wherein the substrate is a glass substrate or a plastic substrate.

18. The method as claimed in claim 12, wherein the insulating film is formed using one of a traveling wave reactor deposition method, a remote plasma atomic layer deposition method and a direct plasma atomic layer deposition method.

19. The method as claimed in claim 12, wherein the inorganic insulating film is $Al_2O_3$, the precursors include aluminum precursor and oxygen precursor, the aluminum precursor is trimethylaluminum or triethylaluminum, and the oxygen precursor is one of water, methanol, ethanol, isopropyl alcohol, ozone, oxygen plasma or water plasma.

20. The method as claimed in claim 12, wherein the inorganic insulating film is aluminum nitride, the precursors include an aluminum precursor and a precursor of nitrogen, the aluminum precursor is trimethylaluminum or triethylaluminum, and the nitrogen precursor is an ammonia plasma or nitrogen plasma.

* * * * *

UNITED STATES PATENT AND TRADEMARK OFFICE
CERTIFICATE OF CORRECTION

PATENT NO.   : 6,926,572 B2
DATED        : August 9, 2005
INVENTOR(S)  : Park et al.

It is certified that error appears in the above-identified patent and that said Letters Patent is hereby corrected as shown below:

Title page,
Item [75], Inventors, delete "Young Shin Kim" and insert -- Yong Shin Kim --.
Item [56], References Cited, U.S. PATENT DOCUMENTS, delete "Asikainen et al" and insert -- Skarp et al. --.
Item [74], *Attorney, Agent, or Firm*, delete "Sokolff" and insert -- Sokoloff --.

Column 10,
Line 51, after "method" insert -- of --.

Column 12,
Line 7, after "titanium oxide" insert -- tantalum oxide --.
Line 8, delete "tantalum oxide $SiO_3N_4$" and insert -- $Si_3N_4$ --.

Signed and Sealed this

Fourteenth Day of March, 2006

JON W. DUDAS
*Director of the United States Patent and Trademark Office*